United States Patent
Rivero et al.

(10) Patent No.: US 10,796,992 B2
(45) Date of Patent: Oct. 6, 2020

(54) STACK OF LAYERS FOR PROTECTING AGAINST A PREMATURE BREAKDOWN OF INTERLINE POROUS DIELECTRICS WITHIN AN INTEGRATED CIRCUIT

(71) Applicant: STMicroelectronics (Rousset) SAS, Rousset (FR)

(72) Inventors: Christian Rivero, Rousset (FR); Jean-Philippe Escales, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/260,394

(22) Filed: Jan. 29, 2019

(65) Prior Publication Data
US 2019/0172786 A1    Jun. 6, 2019

Related U.S. Application Data

(62) Division of application No. 15/379,146, filed on Dec. 14, 2016, now Pat. No. 10,229,880.

(30) Foreign Application Priority Data

Apr. 19, 2016    (FR) ...................... 16 53451

(51) Int. Cl.
*H01L 23/528*    (2006.01)
*H01L 23/532*    (2006.01)
(Continued)

(52) U.S. Cl.
CPC .... *H01L 23/5283* (2013.01); *H01L 21/31111* (2013.01); *H01L 21/76831* (2013.01);
(Continued)

(58) Field of Classification Search
CPC ........... H01L 23/53295; H01L 21/0217; H01L 21/76829
See application file for complete search history.

(56) References Cited

U.S. PATENT DOCUMENTS

| 6,500,770 B1 | 12/2002 | Cheng et al. |
| 2002/0175415 A1 | 11/2002 | Matsunaga |

(Continued)

FOREIGN PATENT DOCUMENTS

| CN | 101231971 A | 7/2008 |
| EP | 2105959 A2 | 9/2009 |

(Continued)

OTHER PUBLICATIONS

First Office Action and Search Report for co-pending CN Appl. No. 201611036400.3 dated Feb. 3, 2019 (13 pages).
(Continued)

*Primary Examiner* — Jonathan Han
(74) *Attorney, Agent, or Firm* — Crowe & Dunlevy

(57) ABSTRACT

A stack including a dual-passivation is etched locally so as to reveal contact pads of an integrated circuit which are situated above a last metallization level of an interconnection part of the integrated circuit. This stack serves to protect the integrated circuit against a breakdown of at least one dielectric region, at least in part porous, separating two electrically conducting elements of the interconnection part of the integrated circuit. Such a breakdown may occur due to electrical conduction assisted by the presence of defects within the at least one dielectric region.

14 Claims, 4 Drawing Sheets

(51) Int. Cl.
*H01L 21/768* (2006.01)
*H01L 21/311* (2006.01)
*H01L 23/31* (2006.01)

(52) U.S. Cl.
CPC .. *H01L 21/76832* (2013.01); *H01L 21/76834* (2013.01); *H01L 21/76892* (2013.01); *H01L 23/3171* (2013.01); *H01L 23/528* (2013.01); *H01L 23/53295* (2013.01); *H01L 23/3114* (2013.01)

(56) References Cited

U.S. PATENT DOCUMENTS

| | | |
|---|---|---|
| 2005/0184397 A1 | 8/2005 | Gates et al. |
| 2008/0173984 A1* | 7/2008 | Lin .................. H01L 21/76834 257/639 |
| 2009/0014887 A1 | 1/2009 | Ohtake et al. |
| 2011/0254165 A1* | 10/2011 | Muranaka ......... H01L 21/76898 257/751 |
| 2013/0062777 A1* | 3/2013 | Ogata .................... H01L 24/05 257/774 |
| 2013/0285203 A1* | 10/2013 | Hiroi ................... H01L 23/5329 257/532 |
| 2013/0341793 A1 | 12/2013 | Suzumura et al. |

FOREIGN PATENT DOCUMENTS

| | | |
|---|---|---|
| JP | H0653210 A | 2/1994 |
| JP | 2007019555 A | 1/2007 |
| JP | 2015159146 A | 9/2015 |

OTHER PUBLICATIONS

INPI Search Report and Written Opinion for FR 1653451 dated Jan. 4, 2017 (9 pages).

* cited by examiner

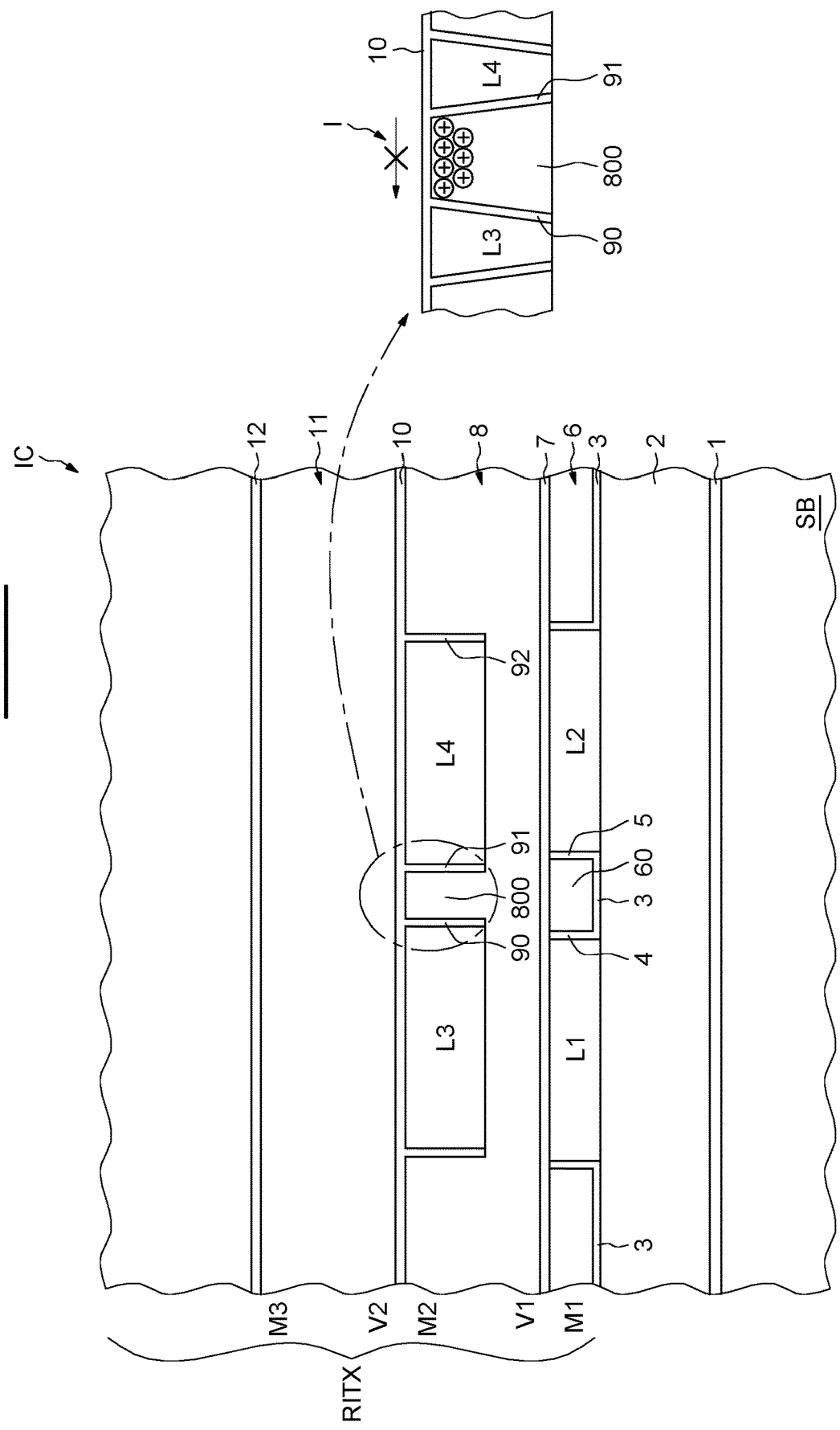

STACK OF LAYERS FOR PROTECTING AGAINST A PREMATURE BREAKDOWN OF INTERLINE POROUS DIELECTRICS WITHIN AN INTEGRATED CIRCUIT

CROSS REFERENCE TO RELATED APPLICATIONS

This application is a divisional of U.S. application for patent Ser. No. 15/379,146 filed Dec. 14, 2016, which claims the priority benefit of French Application for U.S. Pat. No. 1,653,451, filed on Apr. 19, 2016, the disclosures of which are hereby incorporated by reference.

TECHNICAL FIELD

Modes of implementation and embodiments relate to integrated circuits, in particular to CMOS technological methods, and more particularly to protection against the premature breakdown of interline porous dielectrics within the interconnection part (commonly referred to by the acronym BEOL: "Back End Of Line") of an integrated circuit.

BACKGROUND

The interconnection part of an integrated circuit comprises in a conventional manner at least one metallization level, and in general several metallization levels each comprising electrically conducting lines, for example metallic lines such as copper lines, making it possible to interconnect the various components of the integrated circuit to one another and/or to the inputs-outputs of the integrated circuit.

In order to supplement this interconnection, the interconnection part also generally comprises one or more levels of vias, according to a terminology commonly used by the person skilled in the art, situated between the metallization levels and making it possible to link together certain metallic lines.

In certain cases, premature breakdown of an interline dielectric region separating two metallic lines may occur, in particular when these two lines are separated by a very small distance, for example equal to the minimum distance specified by the CMOS technological node used.

This is all the more critical as the CMOS technological node gets ever more advanced, that is to say when this minimum distance becomes ever smaller.

It was indicated in the French Application for U.S. Pat. No. 1,559,337 (U.S. application for patent Ser. No. 15/137,063, incorporated by reference) that this phenomenon of premature breakdown occurred in particular in the presence of a potential difference applied between the two metallic lines, combined with ingress of moisture and/or ionic contamination into the dielectric in particular when the latter is porous.

It has consequently been deduced therefrom that this phenomenon of premature breakdown was due to a conduction mechanism assisted by the presence of defects (traps) in the dielectric. More precisely, the electrons then propagate by jumps between states located in the forbidden band of the dielectric which are assumed to be ionized centers (donors of electrons). This effect results from the lowering of the energy of ionization of these centers with the application of an electric field (potential difference between the lines). This conduction mechanism is then manifested by a current dubbed the Poole-Frenkel current after the name of the two people who demonstrated in a general manner such a mechanism within a dielectric.

In the aforementioned French patent application, it was proposed to afford a solution to this premature dielectric breakdown through the use of at least one non-porous dielectric barrier inserted between a porous part of at least one dielectric region and at least one of two electrically conducting elements, for example a metallic track or line or a via, of an interconnection part of an integrated circuit, so as to protect this integrated circuit against a breakdown of the at least one dielectric region caused by electrical conduction assisted by the presence of defects within the at least one dielectric region.

Stated otherwise this solution is aimed at rupturing as far as possible the conduction path liable to exist more or less long-term in the dielectric, that is to say prevent as far as possible the flow of a leakage current of Poole Frenkel type between the two electrically conducting elements separated by this dielectric region, by using at least one non-porous dielectric barrier.

This being so, it is observed that certain situations were favorable to the appearance of moisture in the porous dielectric regions of the interconnection part. Such is the case in particular when the integrated circuit is situated within a continually powered apparatus, such as for example a TV decoder, the temperature of the integrated circuit then possibly nearing 60-70 degrees Celsius.

Now, as indicated hereinabove, this moisture may lead to the creation of a conduction path in a porous dielectric.

Even if the solution described in the aforementioned French patent application is satisfactory, a need exists to reduce as far as possible, or indeed eliminate, this appearance of moisture within the regions of porous dielectric of an integrated circuit, and this will consequently reduce the risk of premature dielectric breakdown.

SUMMARY

According to one mode of implementation and embodiment, it is consequently proposed to afford a solution to this need.

An integrated circuit comprises generally above the interconnection part (BEOL), a locally etched encapsulation layer, generally an oxide of TEOS (tetra-ethoxy-silane) type, covered with an electrically conducting etched layer, of for example aluminum, intended for the formation of contact pads making it possible to connect the integrated circuit with the exterior, but also for the formation of metallic lines intended to convey supply voltages or else for the formation of particular patterns having particular functions used in particular in secure chips.

This electrically conducting etched layer is itself covered with an insulating layer, typically a filling oxide, for example also an oxide of TEOS type, deposited advantageously with the aid of a high density plasma (HDP) and making it possible to plug the gaps between the etched parts of this electrical layer.

This insulating layer is itself covered with a relatively thick upper passivation layer ensuring mechanical and chemical protection of the integrated circuit.

The insulating layer—passivation layer stack is etched to reveal the contact pads.

After much research, the inventors have observed in a surprising manner that the insulating layer in particular of the TEOS oxide type formed an entry path for moisture, although this material was cited in the aforementioned French patent application as being able to be used in the guise of non-porous dielectric barrier to prevent as far as possible the flow of a leakage current of Poole Frenkel type.

Stated otherwise, the inventors have observed that this non-porous character of the oxide of TEOS type was not sufficient to render this material impermeable to moisture and that the sides of the stack at the level of the contact pads were consequently entry gates for moisture to penetrate the integrated circuit.

Hence it is in particular proposed to afford a solution to this problem through the use of a stack comprising a first non-porous lower passivation layer, an electrically insulating layer and an upper passivation layer, which stack is etched locally so as to reveal said contact pads of an integrated circuit which are situated above the last metallization level of an interconnection part of the integrated circuit, so as to protect the integrated circuit against a breakdown of at least one dielectric region, at least in part porous, separating two electrically conducting elements of the interconnection part of the integrated circuit, breakdown caused by electrical conduction assisted by the presence of defects within the at least one dielectric region.

Stated otherwise, instead of protecting the sides of the stack at the level of the contact pads, a non-porous, in particular to moisture, lower passivation layer, for example silicon nitride SiN, will be deposited on the electrically conducting etched layer and on the revealed part or parts of the etched encapsulation layer so as to supplement the stack with this non-porous lower passivation layer.

Such a solution is highly compatible with a CMOS technological method in the sense that it requires the addition of only a single method step (the formation of the lower passivation layer) but without requiring any modification or addition of masks or any modification of the layout diagram of the integrated circuit.

Furthermore this novel solution is compatible with that described in the aforementioned French patent application (use of a non-porous dielectric barrier within a porous dielectric).

Thus, according to an aspect, there is proposed a method for protecting an integrated circuit against an electrical conduction assisted by the presence of defects within a dielectric region, at least in part porous, separating two electrically conducting elements of the interconnection part of the integrated circuit, comprising after etching of an encapsulation layer formed above the last metallization level of the interconnection part and etching of an electrically conducting layer situated above the etched encapsulation layer and intended at least for the formation of contact pads, a formation on the electrically conducting etched layer and on the revealed part or parts of the etched encapsulation layer of a stack comprising a non-porous lower passivation layer, an electrically insulating layer and an upper passivation layer, and a local etching of the stack so as to reveal the contact pads.

According to one mode of implementation the non-porous lower passivation layer is characterized by a smaller quantity of porosities than a threshold S.

This threshold S is for example equal to 5%.

Stated otherwise the non-porous lower passivation layer exhibits a volume of porosities of less than S % of the total volume of this lower passivation layer.

The thickness of this lower passivation layer must not be too small so as to ensure its anti-moisture barrier function and must not be too thick so as to be able to hug the shape of the electrically conducting etched layer, of for example aluminium.

The person skilled in the art will know how to tailor this thickness as a function of the situations.

That said, by way of indication, a thickness of the lower passivation layer of between 50 nm and 150 nm is a good compromise.

The lower passivation layer comprises for example silicon nitride SiN. That said, other materials could be used such as for example any material of the type $Si_xN_y$, such as for example $Si_3N_4$.

The upper passivation layer is advantageously thicker than the lower passivation layer and may also comprise silicon nitride SiN.

According to another aspect there is proposed an integrated circuit, comprising: an interconnection part ("BEOL"), an encapsulation layer situated above the last metallization level of the interconnection part, an electrically conducting layer situated above the encapsulation layer and forming at least contact pads contacting metallic tracks of the last metallization level through the encapsulation layer, and a passivation stack above the electrically conducting layer and above parts of the encapsulation layer, the passivation stack possessing apertures opening out opposite the contact pads and comprising a non-porous lower passivation layer, of for example SiN, an electrically insulating layer, for example an oxide of TEOS type, and an upper passivation layer, for example SiN and advantageously thicker than the lower passivation layer.

According to one embodiment the non-porous lower passivation layer exhibits a smaller quantity of porosities than a threshold, for example equal to 5%, with a thickness that may be between 50 nm and 150 nm.

As indicated previously the present solution (dual passivation) can be combined within the same integrated circuit with the solution described in the aforementioned French patent application (dielectric barrier inserted into porous dielectric).

Stated otherwise, according to an embodiment, the interconnection part comprises at least one metallization level possessing electrically conducting elements mutually separated by dielectric regions, and the integrated circuit comprises at least one non-porous dielectric barrier situated between a porous part of at least one dielectric region and at least one of the two electrically conducting elements separated by the at least one dielectric region.

The at least one non-porous dielectric barrier preferentially has a thickness lying between a lower thickness and an upper thickness.

The lower thickness is the acceptable limit thickness for obtaining a good barrier effect in relation to the leakage current of the dielectric while the upper thickness is chosen so as not to overly increase the dielectric constant of the dielectric region comprising the porous part preferentially with low dielectric constant and the non-porous dielectric barrier.

By way of indication, a thickness of non-porous dielectric barrier of between 10 nm and 30 nm is acceptable.

Numerous materials can be used for the at least one non-porous dielectric barrier. It is for example possible to use ternary nitrides or else Tetra Ethyl Oxy Silane or tetra-ethoxy-silane (oxide of TEOS type).

That said, silicon carbonitride (SiCN) either amorphous or crystalline is a preferred material because in particular of its good adhesion to the vertical sides of the porous central part of the dielectric region.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION

Figure 1:
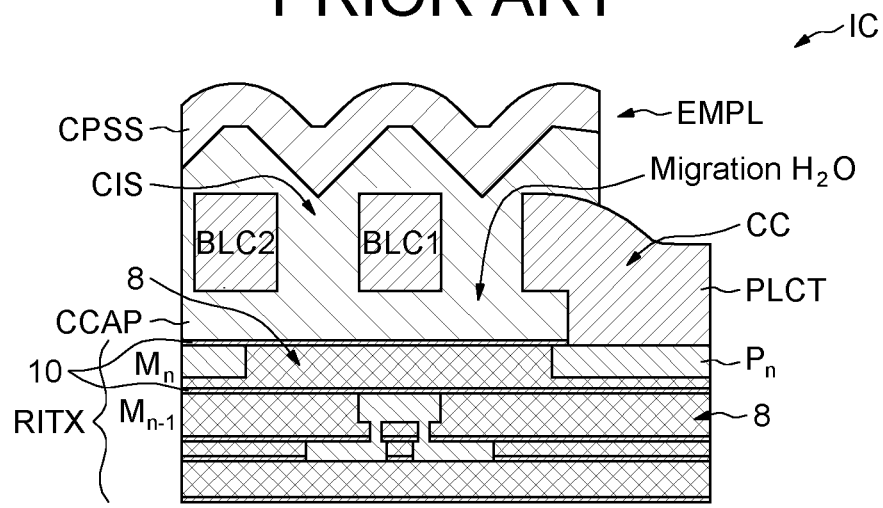
FIG. 1 schematically illustrates an exemplary integrated circuit of the prior art, and FIGS. 2 to 7 schematically illustrate various modes of implementation and embodiments.

In FIG. 1, which illustrates an exemplary integrated circuit IC according to the prior art, the reference RITX designates the interconnection part (BEOL) of the integrated circuit.

This interconnection part RITX comprises several metallization levels and several levels of vias.

In this FIG. 1, only the last-but-one metallization level $M_{n-1}$ and the last metallization level $M_n$ have been referenced.

The various metallic tracks, of for example copper, as well as the various vias are shrouded in a dielectric material generally referred to by the person skilled in the art by the acronym IMD ("Inter Metal Dielectric").

The reference 8 designates here the dielectric zones shrouding the metallic tracks of the metallization level $M_n$ as well as the metallic tracks of the metallization level $M_{n-1}$ and the vias culminating at this metallization level.

The dielectric material used in these zones 8 is a porous material with low dielectric constant (low K material). By way of example, the material used is carbon doped hydrogenated silicon oxide (SiOCH) having a percentage of porosities of between 20 and 30 and a dielectric constant K equal to 3.

Each IMD zone 8 is encapsulated between two protection layers 10 parallel to the substrate and intended to protect the metal of the metallic tracks from oxidation. It is for example possible to use silicon carbonitride (SiCN) which makes it possible to protect the copper metallic tracks from oxidation and also avoids the diffusion of copper into the IMD dielectric material.

The integrated circuit IC also comprises, in a conventional manner, an encapsulation layer CCAP situated above the last metallization level $M_n$ of the interconnection part RITX. This encapsulation layer CCAP is made for example of oxide of TEOS type and is etched locally so as to allow a contact pad PLCT, of for example aluminum, to contact for example the metallic track $P_n$, of the upper metallization level $M_n$.

This contact pad PLCT results from the etching of the electrically conducting layer CC, here aluminum, and, as illustrated in this FIG. 1, this layer CC can also serve to create aluminum patterns BLC1, BLC2, for example lines contacting other contact pads, not represented in this figure, and which lines can be used to convey power supply signals or else lines used for other functions, such as for example the formation of a gridwork, incorporated into secure chips.

The etched layer CC is thereafter covered with an insulating layer CIS, typically oxide of TEOS type deposited by a high density plasma (HDP) which makes it possible in particular to properly plug the gaps between the patterns of the layer CC.

The integrated circuit IC finally comprises, above the insulating layer CIS, an upper passivation layer CPSS, generally thick, for example of the order of 5500 Ångströms, which ensures mechanical protection as well as chemical protection of the integrated circuit.

This stack formed by the insulating layer CIS and the upper passivation layer CPSS is etched so as to make apertures opening out opposite the contact pad(s) PLCT.

That said, as explained hereinabove, this stack EMPL, and in particular the insulating layer, is an entry point for moisture which will thereafter possibly generate conduction paths in the porous dielectric 8.

Reference is now made more particularly to FIGS. 2 to 6, which illustrate different steps of a mode of implementation according to the invention making it possible to limit to the maximum, or indeed to eliminate, the ingress of moisture into the chip from the exterior environment.

In these figures, elements which are analogous or have functions analogous to those described in FIG. 1, have identical references to those which they had in FIG. 1.

Figure 2:
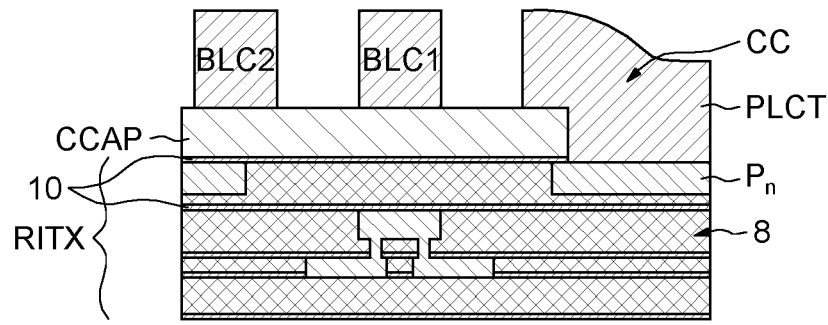

Depicted in FIG. 2 is the electrically conducting layer CC which, after etching, has formed the contact pad PLCT as well as the patterns BLC1 and BLC2.

Figure 3:
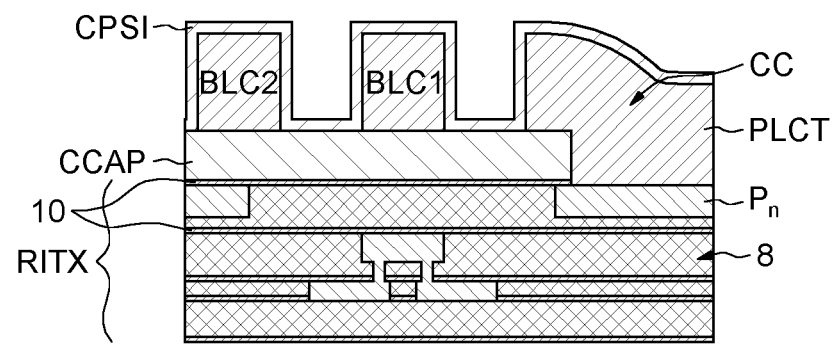
Figure 4:
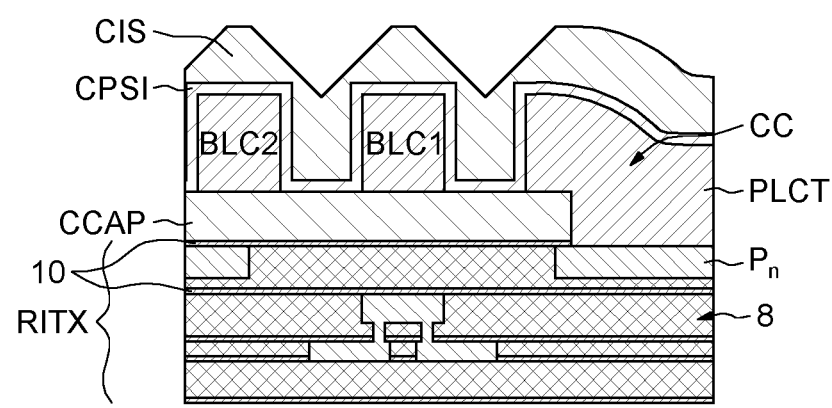

Instead of depositing the insulating layer CIS directly, a lower passivation layer CPSI that is less thick than the upper passivation layer CPSS, typically having a thickness of between 50 and 150 nanometers, is firstly deposited (FIG. 3).

This lower passivation layer CPSI is non-porous, in particular to moisture, and may be for example formed of silicon nitride SiN.

Figure 5:
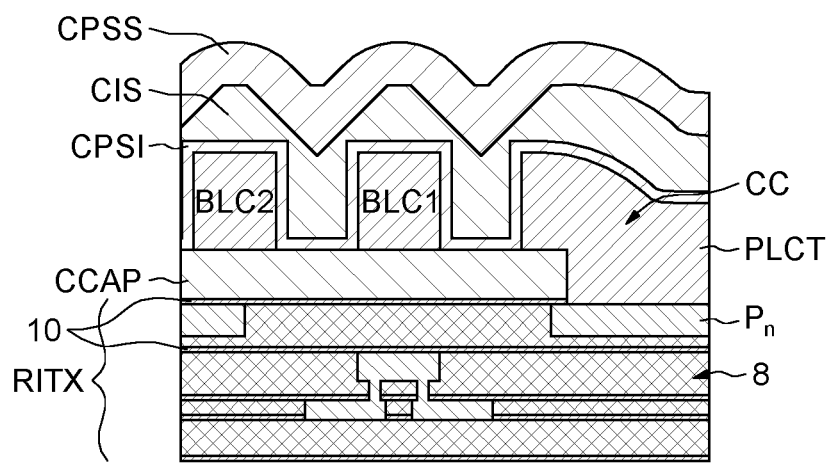

The insulating layer CIS, for example oxide of TEOS type is deposited thereafter (FIG. 4) and then, as illustrated in FIG. 5, the whole of the upper passivation layer CPSS is covered.

Figure 6:
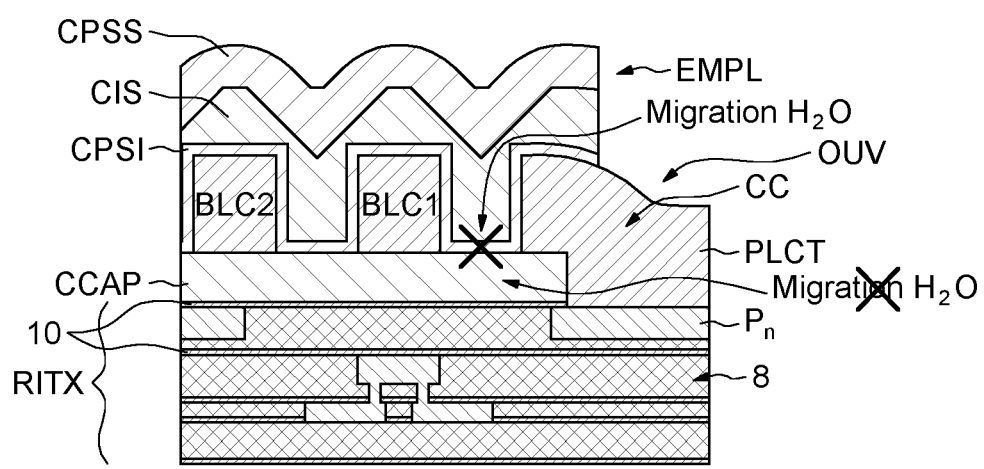

After etching of the stack EMPL comprising the lower passivation layer CPSI, the insulating layer CIS and the upper passivation layer CPSS, so as to make an aperture OUV opening out opposite the contact pad PLCT, the structure illustrated in FIG. 6 is obtained.

This structure is therefore distinguished from the prior art illustrated in FIG. 1 by a stack EMPL comprising a dual passivation (lower passivation layer CPSI and upper passivation layer CPSS). Therefore, possible migration of moisture through the insulating layer CIS from the sides of the stack EMPL will be very greatly impeded or indeed blocked by the presence of the non-porous lower passivation layer CPSI.

It has therefore been made possible to very greatly limit or indeed to eliminate the risk of ingress of moisture into the porous dielectric of the integrated circuit IC from the exterior and this will consequently limit the risk of premature breakdown of this porous dielectric.

Moreover, this novel method is perfectly compatible with the conventional CMOS methods and requires only the addition of an extra step, namely the deposition of the lower passivation layer CPSI.

The embodiment illustrated in FIG. 6 can be combined with the embodiment illustrated in FIG. 7 which, as described in the aforementioned French patent application, provides for the use of at least one non-porous dielectric barrier inserted into the porous dielectric region separating two metallic lines.

FIG. 7 represents an exemplary bottom part of the integrated circuit of FIG. 6.

More precisely, the integrated circuit IC comprises a semiconductor substrate SB within and on which have been made various components such as transistors, not represented here for the sake of simplification.

These components as well as the surface of the substrate SB are conventionally covered with a passivation layer 1, for example a silicon dioxide layer.

The various components are separated from the interconnection part RITX (BEOL) of the integrated circuit by a first dielectric region 2 commonly referred to by the person skilled in the art by the acronym PMD (Pre Metal Dielectric).

As indicated hereinabove the interconnection part RITX comprises several metallization levels and several levels of vias. In this example, three metallization levels M1, M2 and M3 have been represented associated with two levels of vias V1 and V2.

In this exemplary embodiment, two metallic tracks or lines L1 and L2 within the metallization level M1 and two metallic tracks L3 and L4 at the level of the second metallization level M2 have been represented.

In this example, the metallic tracks of the level M3 as well as the vias situated at the level of vias V1 and V2 are situated at other locations of the integrated circuit and are therefore not represented in this figure.

As indicated previously, the various metallic tracks, of for example copper, and vias, are shrouded in the IMD (Inter Metal Dielectric) dielectric material.

These dielectric zones IMD are referenced in this FIG. 7 by the references 6, 8 and 11.

The protection layers (for example silicon carbonitride (SiCN)), parallel to the substrate and encapsulating the zones IMD 6, 8 and 11 are referenced 3, 7, 10 and 12.

In FIG. 7, it is seen that the interline dielectric region separating the two metallic lines L1 and L2 comprises a porous central part 60, formed here of SiOCH, flanked by two dielectric barriers 4 and 5 respectively situated between the porous central part 60 and the two metallic lines L1 and L2.

Likewise, the interline dielectric region separating the two lines L3 and L4 comprises a porous central part 800, formed of SiOCH, flanked by two dielectric barriers 90 and 91 respectively situated between the porous central part 800 and the two metallic lines L3 and L4.

These dielectric barriers 4, 5, 90, 91 are formed of a non-porous dielectric material that is to say exhibiting a percentage of porosities of less than 5.

In practice, SiCN which exhibits a percentage of porosities between 2 and 3 is advantageously used as non-porous dielectric barrier.

Moreover, as seen in FIG. 7, each metallic line, for example the metallic line L4, is itself flanked by two non-porous dielectric barriers, namely the barrier 91 and the barrier 92.

Furthermore, the lower part of each metallic line is not in contact with a non-porous dielectric barrier so as to allow possible electrical contact with a subjacent via.

The interline dielectric region separating the metallic lines L3 and L4 is represented in greater detail in the right part of FIG. 1.

It will be noted that in this right part, the dielectric region has been represented with a trapezoidal shape which is a shape closer to reality since it results from the etching method.

As explained hereinabove, should moisture and/or ionic contamination be present, and because also of the trapezoidal shape of the dielectric region, the density of traps increases at the interface and the increased presence of the ions at this interface contributes to the creation of a leakage current I (current assisted by defects). That said, the presence of the non-porous dielectric barriers 90 and 91 makes it possible to interrupt the conduction path between the two metallic lines and consequently to very greatly decrease or indeed to eliminate this leakage current I.

Thus the dual passivation described in particular in conjunction with FIG. 6 makes it possible to limit or indeed to avoid the ingress of moisture into the integrated circuit, and in case of residual moisture, the presence of the non-porous dielectric barriers makes it possible to interrupt the conduction path between the two metallic lines and consequently to very greatly decrease or indeed to eliminate the leakage current I.

The integrated circuit is thus still more effectively protected against premature breakdown of the interline dielectric regions.

What is claimed is:

1. A method for protecting an integrated circuit against an electrical conduction assisted by the presence of defects within a dielectric region, at least in part porous, separating two electrically conducting elements of an interconnection part of the integrated circuit, wherein the interconnection part comprises a plurality of metallization levels including a last metallization level which, of the plurality of metallization levels, is the metallization level located furthest from a semiconductor substrate, the method comprising:
   etching an encapsulation layer formed above the last metallization level of the interconnection part;
   etching an electrically conducting layer situated above the etched encapsulation layer for the formation of contact pads;
   forming, on the etched electrically conducting layer and on revealed part or parts of the etched encapsulation layer, a stack comprising a non-porous lower passivation layer having a first thickness, an electrically insulating layer having a second thickness and an upper passivation layer having a third thickness, wherein the third thickness is greater than the first thickness; and
   locally etching through the stack so as to reveal an upper surface of the contact pads.

2. The method according to claim 1, wherein the non-porous lower passivation layer exhibits a quantity of porosities that is less than a percentage.

3. The method according to claim 2, wherein the percentage is equal to 5%.

4. The method according to claim 1, wherein the first thickness of the lower passivation layer lies between 50 nm and 150 nm.

5. The method according to claim 1, wherein the lower passivation layer comprises a material selected from the group consisting of: silicon nitride SiN and any material of the type $Si_xN_y$.

6. The method according to claim 1, wherein the upper passivation layer comprises silicon nitride SiN.

7. The method according to claim 1, wherein the non-porous lower passivation layer is in contact with the electrically insulating layer and the electrically insulating layer is in contact with the upper passivation layer.

8. A method for protecting an integrated circuit that includes an interconnection part formed by a plurality of metallization levels supported by a semiconductor substrate, comprising:
   forming an encapsulation layer above a last metallization level of the plurality of metallization levels of an integrated circuit, said last metallization level being the metallization level of the plurality of metallization levels which is located furthest from the semiconductor substrate;
   depositing an electrically conductive layer on said encapsulation layer;

patterning the electrically conductive layer to form a contact pad and form an interconnection part of the integrated circuit that includes at least two electrically conducting elements;

depositing a non-porous lower passivation layer directly on said at least two electrically conducting elements and an exposed upper surface of the encapsulation layer;

depositing an electrically insulating layer directly on the non-porous lower passivation layer;

depositing an upper passivation layer directly on the electrically insulating layer; and locally etching through the upper passivation layer, the electrically insulating layer and the non-porous lower passivation layer to expose a surface of said contact pad.

9. The method of claim 8, wherein the non-porous lower passivation layer has a first thickness, the electrically insulating layer has a second thickness and the upper passivation layer has a third thickness, and wherein the third thickness is greater than the first thickness.

10. The method of claim 8, wherein the non-porous lower passivation layer exhibits a quantity of porosities that is less than a percentage.

11. The method of claim 10, wherein the percentage is equal to 5%.

12. The method of claim 8, wherein the first thickness is between 50 nm and 150 nm.

13. The method of claim 8, wherein the lower passivation layer comprises a material selected from the group consisting of: silicon nitride SiN and any material of the type $Si_xN_y$.

14. The method of claim 8, wherein the upper passivation layer comprises silicon nitride SiN.

* * * * *